(12) United States Patent
Vermeulen et al.

(10) Patent No.: US 8,707,443 B2
(45) Date of Patent: Apr. 22, 2014

(54) CIRCUIT WITH TESTABLE CIRCUIT COUPLED TO PRIVILEGED INFORMATION SUPPLY CIRCUIT

(75) Inventors: Hubertus Geradus Hendrikus Vermeulen, Eindhoven (NL); Andre Krijn Nieuwland, Waalre (NL)

(73) Assignee: NXP B.V., Eindhoven (NL)

( * ) Notice: Subject to any disclaimer, the term of this patent is extended or adjusted under 35 U.S.C. 154(b) by 225 days.

(21) Appl. No.: 13/058,170

(22) PCT Filed: Aug. 4, 2009

(86) PCT No.: PCT/IB2009/053388
§ 371 (c)(1),
(2), (4) Date: Feb. 8, 2011

(87) PCT Pub. No.: WO2010/016004
PCT Pub. Date: Feb. 11, 2010

(65) Prior Publication Data
US 2011/0173702 A1    Jul. 14, 2011

(30) Foreign Application Priority Data

Aug. 8, 2008 (EP) .................................. 08162115

(51) Int. Cl.
*G06F 7/04* (2006.01)
*G06F 17/30* (2006.01)
*H04N 7/16* (2011.01)

(52) U.S. Cl.
USPC ........................................................ 726/26

(58) Field of Classification Search
USPC ........................................................ 726/26
See application file for complete search history.

(56) References Cited

U.S. PATENT DOCUMENTS

| | | | |
|---|---|---|---|
| 5,357,572 A | 10/1994 | Bianco et al. | |
| 6,499,124 B1 | 12/2002 | Jacobson | |
| 2003/0204801 A1 | 10/2003 | Tkacik et al. | |
| 2004/0148480 A1 | 7/2004 | Watt et al. | |
| 2004/0153801 A1 | 8/2004 | Kayukawa et al. | |
| 2005/0172185 A1 | 8/2005 | Bancel et al. | |
| 2005/0257053 A1 | 11/2005 | Genty et al. | |
| 2007/0088519 A1 | 4/2007 | Yannou et al. | |
| 2008/0010570 A1 | 1/2008 | Yamazaki | |
| 2008/0104147 A1* | 5/2008 | Schwaab et al. | 707/204 |
| 2009/0172411 A1* | 7/2009 | Kershaw et al. | 713/189 |
| 2010/0264932 A1* | 10/2010 | Marinissen et al. | 324/537 |

FOREIGN PATENT DOCUMENTS

| | | |
|---|---|---|
| DE | 43 21 151 C1 | 11/1994 |
| EP | 1 439 398 | 7/2004 |
| JP | 2002 228716 A | 8/2002 |

OTHER PUBLICATIONS

International Search Report for Application PCT/IB2009/053388 (Nov. 12, 2009).

* cited by examiner

*Primary Examiner* — Kambiz Zand
*Assistant Examiner* — Stephen Sanders

(57) ABSTRACT

A circuit is operable in a normal operating mode and a test mode. The circuit contains a privileged information supply circuit (12) coupled to the testable circuit (10). A test access circuit (19) provides access to the testable circuit (10). A test control circuit (18) controls switching of the test access circuit (19) to the test mode. A multiplex circuit (16) couples the privileged information supply circuit (12) to the testable circuit (10) for access to privileged information in the normal mode. In the test mode the shadow information supply circuit (14) is coupled to the testable circuit (10) instead.

10 Claims, 3 Drawing Sheets

CIRCUIT WITH TESTABLE CIRCUIT COUPLED TO PRIVILEGED INFORMATION SUPPLY CIRCUIT

FIELD OF THE INVENTION

The invention relates to an electronic circuit with test access facilities and memory for secure data.

BACKGROUND OF THE INVENTION

U.S. Pat. No. 5,357,572 discusses the conflicting interests of circuit testing and protection of confidential data. On one hand, circuit testing requires that any circuit fault be made observable, which is best served by enabling direct test access to the circuit at a level of detail that suffices to expose all faults. In many cases, a test mode is used wherein test data is shifted in and out of the circuit via a scan chain, from which a test data pattern is applied to circuit parts under test and into which a response to the test data pattern is captured. On the other hand, protection of confidential data such as passwords and decryption keys stored in a memory in the circuit requires that access be impossible at a level of detail that enables reconstruction of the confidential data.

U.S. Pat. No. 5,357,572 proposes a solution to this dilemma that uses a bypass of part of the scan chain that can be used to observe the memory with confidential data. After initial tests using this part of the scan chain, testing other than via the bypass circuit is permanently disabled. This can be done by writing to a read once memory that controls the bypass, by blowing a fuse etc. Another option is to require a password to deactivate the bypass, but this makes the circuit more susceptible to hacking.

These solutions have the problem that they can obstruct the analysis of failure of the circuit, alone or when placed in the context of an application, for example as part of debugging.

SUMMARY OF THE INVENTION

Among others, it is an object to provide for a circuit that allows for access to the circuit that may be used for debugging purposes, while protecting against unauthorized access to confidential data.

A circuit according to claim 1 is provided. This circuit is operable in a normal operating mode and a test mode. The circuit comprises a testable circuit that relies on privileged information from a privileged information supply circuit. The testable circuit may be a processor for example, programmed to perform operations using the privileged information, for example operations like decryption or encryption using a key supplied by the privileged information supply circuit, or verification of received data using information from the privileged information supply circuit. In other examples the testable circuit may be a function specific circuit for performing the operations using the privileged information.

The circuit has a test access circuit and a test control circuit. The test control circuit is configured to control switching of the test access circuit to a test mode, wherein it has access to the testable circuit. A multiplex circuit is used to replace the privileged information supply circuit by a shadow information supply circuit selectively at least in response to a control signal from the test control circuit indicating that the test access circuit is enabled to capture test response signals from the testable circuit in the test mode. In this way access to data that depends on the privileged information supply circuit is prevented in the test mode, while maintaining functional connections to a information supply circuit that allow elaborate testing and/or debugging.

In an embodiment a programming circuit is provided to program information into the shadow information supply circuit. Thus, testing and/or debugging may be performed using programmable information. An operating method may comprise loading external information that represents a copy of the privileged information in the privileged information supply circuit into the shadow information supply circuit. Thus, those that know this information can test or debug the circuit entirely according to operating conditions, but those that don't known this information cannot access it. In an embodiment, the circuit may be configured to allow use of the shadow information supply circuit also in the normal operating mode, for example for debugging purposes.

In a further embodiment the programming circuit is configured to impose a restriction on a frequency and/or number of times at which it enables programming of the information in the shadow information supply circuit. Thus, reverse engineering attacks, involving brute force trying of many alternative keys may be made impracticable.

BRIEF DESCRIPTION OF THE DRAWINGS

These and other objects and advantages will become apparent from a description of exemplary embodiments, using the following Figures.

DETAILED DESCRIPTION OF EXEMPLARY EMBODIMENTS

Figure 1:
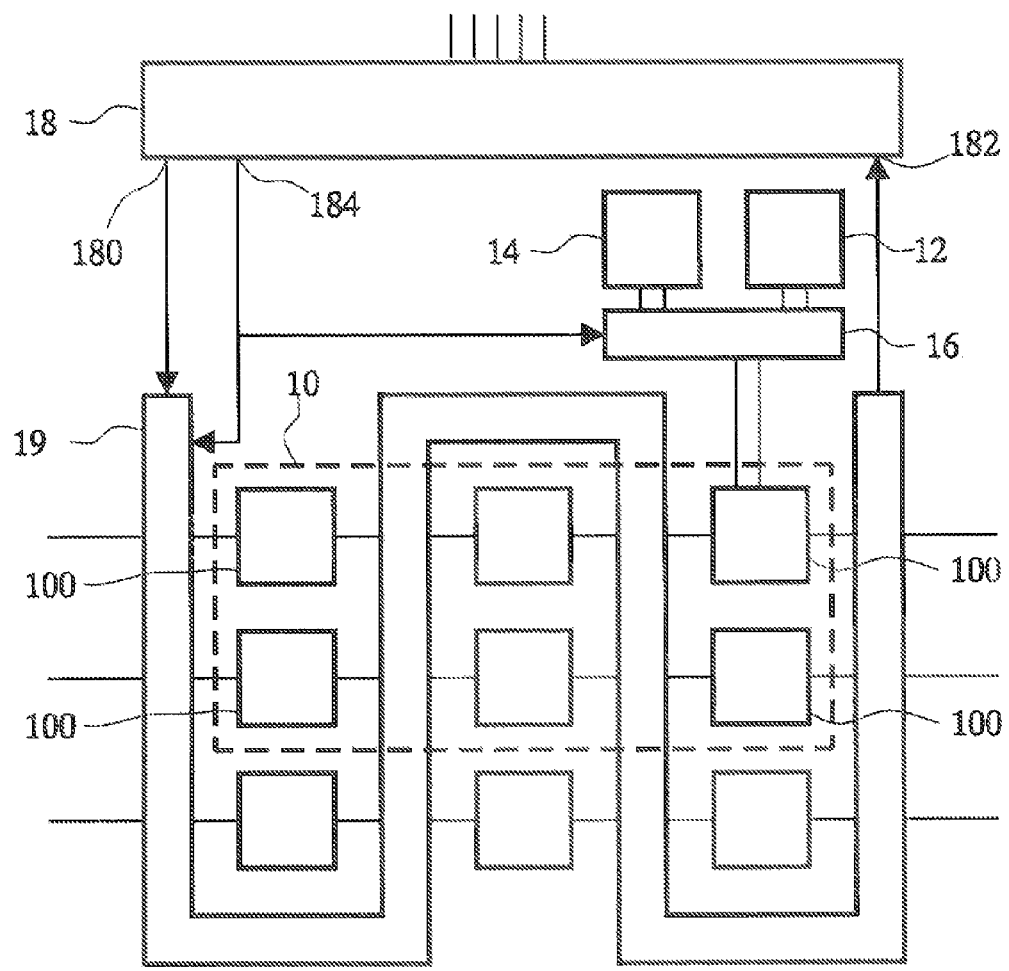
FIGS. 1-3 show circuits with a scan chain and a memory for privileged information.

FIG. 1 shows a circuit (in an embodiment a single integrated circuit) comprising a decryptor 10, a key memory 12, a shadow key memory 14, a multiplex circuit 16, a test control circuit 18 and a scan chain 19. Key memory 12 and shadow key memory 14 are coupled to decryptor 10 via multiplex circuit 16. Decryptor 10 may be an instruction processor core with a program memory containing instructions of a program to retrieve keys from key memory 12 and to use the retrieved keys for decryption. Alternatively decryptor 10 may be a function specific logic circuit to perform this function.

Although an example has been shown wherein the circuit contains a decryptor 10, i.e. a circuit that translates encrypted signals to decrypted signals according to a translation algorithm that depends on a key, it should be understood that more or other circuits may be present that require secret information. Examples are encryptors, for translating signals to encrypted signals, password checkers, for comparing received password data with secret password data, identification circuits for executing procedures wherein an external agent identifies itself to the circuit, identifier supply circuits which retrieve secret identifiers or seeds to generate such identifiers from key memory 12 etc. In each case, key memory, or a memory for other privileged information serve to supply such information to sub-circuits 100 during normal operation. Thus, key memory functions as a privileged information supply circuit.

Scan chain 19 comprises a chain of scan cells, each comprising a flip-flop (not shown) and runs through decryptor 10, where scan chain 19 is coupled to various logic sub-circuits 100 of decryptor 10. Scan chain 19 is also coupled to other sub-circuits of the overall circuit. By way of example, a single scan chain 19 and a limited number of sub-circuits 100 are shown. In practice, a far more complicated arrangement may be used, comprising more sub-circuits and/or more scan chains.

Thus, scan chain 19 forms a test access circuit. The use of scan chain 19 or similar test access circuit makes testable the sub-circuits 100 of decryptor 10 and other sub-circuits testable circuits. Sufficiently detailed access is provided so that circuit faults from a set of testable circuit faults (e.g. stuck at faults of all circuit nodes) can be detected. Sub-circuits 100 may be combinatorial logic circuits for example, without state holding circuits such as flip-flops, the latter being provided in scan chain 19.

Test control circuit 18 has a test data output 180 and a test data input 182 coupled to scan chain 19, as well as a control output 184 coupled to a control input of scan chain 19. By way of example, the control output 184 of test control circuit 18 is also coupled to a control input of multiplex circuit 16. Although the control connection is shown as a single line, it should be appreciated that this may involve more than one conductor and that the control conductor or conductors may be connected to a plurality of scan cells in scan chain 19 to provide the same control signal to all scan cells, optionally via buffer circuits.

In operation, test control circuit 18 is used to switch scan chain 19 between a normal mode and a test mode, using control output 184. Any suitable test interface may be used to control test control circuit 18 to do so. An IEEE 1149.1 compatible test interface may be used for example. In the normal mode, flip-flops in scan chain 19 are made transparent or act as part of decryptor 10, capturing data from sub-circuits 100 and supplying the captured data to other sub-circuits 100, in successive operating cycles. In the test mode flip-flops in scan chain 19 are collectively made to act as a shift register, through which test data is shifted from test data output 180 and/or to test data input 182. Scan chain 19 is configured to be switched to capture operation in the test mode, wherein it captures data from sub-circuits 100. Test control circuit 18 is configured to supply a control signal to scan chain 19 to switch to capture operation, between shifting operations to shift in a test data pattern and to shift out a test response pattern. Additionally, scan chain 19 may be configured to supply default output signals to sub-circuits 100 during shifting, and to switch to supply of test data in a test supply operation controlled by test control circuit 18. In an embodiment, test control circuit 18 is configured to apply a reset signal to a reset input of scan chain 19 to reset its content upon entering the test mode and optionally also when switching from the test mode, or to block output of information captured before switching to the test mode.

Multiplex circuit 16 is switchable between two modes in which it couples key memory 12 and shadow key memory 14 to decryptor 10 respectively. The mode selection is controlled by the test control output 184 of test control circuit 18. At least when the scan chain 19 is made to operate in the normal mode, the control signal switches multiplex circuit 16 to the mode wherein key memory 12 is coupled to decryptor 10. At least when the scan chain 19 is made to perform the capture operation in the test mode, the control signal switches multiplex circuit 16 to the mode wherein shadow key memory 14 is coupled to decryptor 10. Thus, key memory 12 is made invisible when scan chain 19 is in the test mode. Instead, the circuit uses the shadow key memory 14.

In an embodiment, multiplex circuit 16 is configured to the mode wherein shadow key memory 14 is coupled to decryptor 10 also during shifting in the test mode. In an embodiment, test control circuit 18 is configured to make multiplex circuit 16 couple shadow key memory 14 to decryptor 10 at least both when capture operation into scan chain 19 is allowed and when test data from scan chain 19 is enabled to affect signals at multiplex circuit 16 or sub-circuits that depend on signals from key memory or shadow key memory 14.

Although an embodiment has been shown wherein the control signal for the scan chain 19 is used to control multiplex circuit 16 as well, it should be appreciated that alternatively other test or debugging dependent signals may be generated to control multiplex circuit 16 to substitute shadow key memory 14 when scan chain 19 is used. For example, a test control block enable signal may be used, a test point register enable signal, a breakpoint enable signal, a real time trace enable signal, a shift enable signal, or other signals that enable observability.

Although a common control output 184 of test control circuit 18 is shown coupled to both scan chain 19 and multiplex circuit 16 to make multiplex circuit 16 couple shadow key memory 14 to decryptor 10, it should be understood that separate control outputs may be used for scan chain 19 and multiplex circuit 16 when test control circuit 18 is configured to switch the control signals on these output in combination. The use of a single output may simplify the circuit and make it more difficult for hackers to knock out the use of shadow key memory 14.

In a further embodiment the circuit is designed to allow the user to select use of the shadow key memory 14 in the normal operating mode. A control register (not shown) may be provided for example, at least one of the sub-circuits 100 being coupled to this control register to set its content, the control register being, coupled to a control input of multiplex circuit 16. In this case the signal from the control register may control whether key memory 12 or shadow key memory 14 is coupled to decryptor 10 in the normal operating mode. However, in the test mode this selection is overruled, test control circuit 18 forcing multiplex circuit 16 to couple shadow key memory 14 to decryptor 10, at least when capture is enabled. In another embodiment, the circuit may be designed that such use of the shadow key memory 14 in normal operation is impossible, to prevent use of the circuit with false keys.

A person that uses the test circuit to access the sub-circuits 100 may be allowed to use and even replace the content of the shadow key memory 14 in the test mode, as if it was confidential data. However, this does not affect operation in the normal mode, or compromise its security. As a result debugging can be performed without compromising security. The circuit of FIG. 1 may be placed in the context of a larger circuit, for example on a printed circuit board, with normal operating connections and connections to the test control circuit 18 from the larger circuit to perform debugging and/or testing, without compromising security.

In a further embodiment memories of mutually different design are used for key memory 12 and shadow key memory 14 respectively. In one example, a user programmable and a non-programmable or one time programmable memory may be used for shadow key memory 14 and key memory 12 respectively. As another example, a design may be used that leads to higher wear for shadow key memory 14, compared to wear of key memory 12.

In a method of using the circuit, a copy of the privileged information in key memory 12 is entered into shadow key memory 14 via scan chain 19. Thus, the circuit can be made to work entirely as if key memory 12 is used during testing. It should be emphasized that this is not done by copying information from key memory 12 to shadow key memory 14 within the circuit. Thus, unauthorized persons cannot perform this type of testing. Only authorized persons that have information about the keys in key memory 12 can perform such testing.

In an embodiment decryptor 10 or any other circuit in its place may be designed in conjunction with the information in key memory 12 so that it will be properly testable or debuggable only if the proper key is available. By writing the keys into shadow key memory 14 from the outside, testing and debugging can be enabled without compromising security against those who do not know the necessary key.

Figure 2:
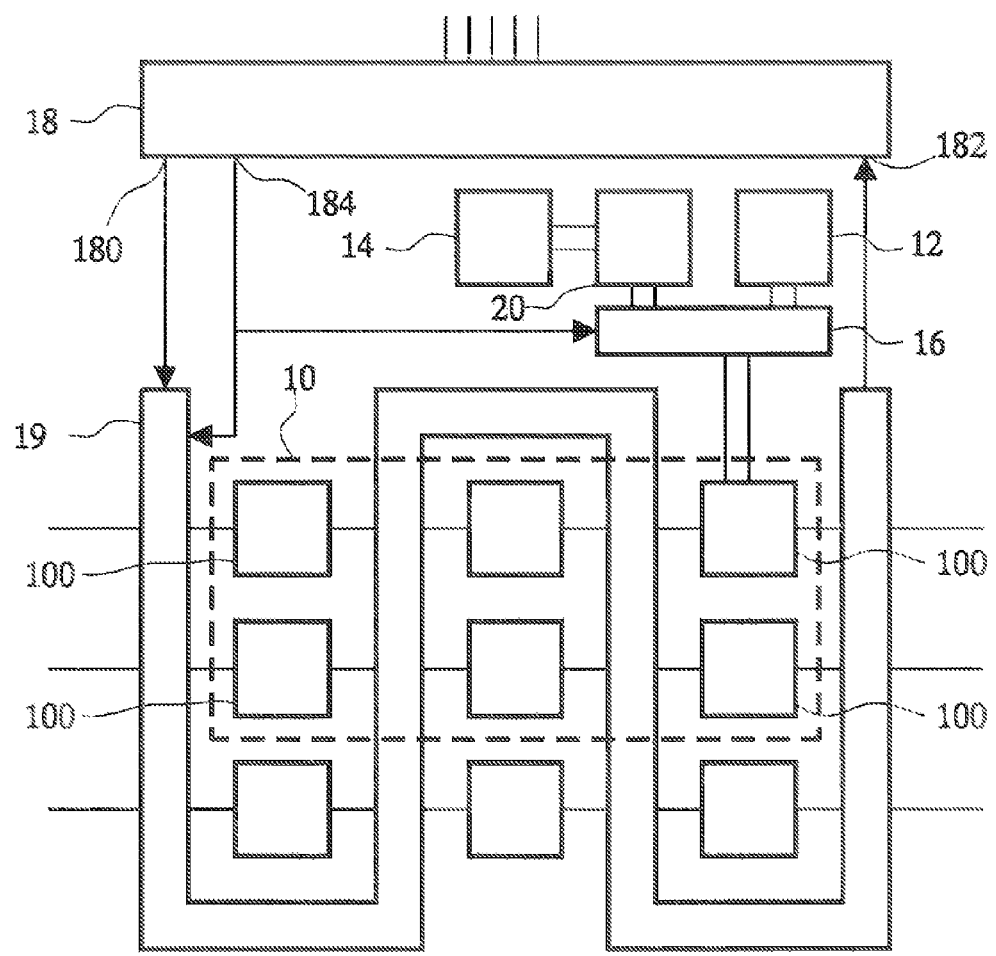

FIG. 2 shows an embodiment wherein a restrictive programming circuit 20 has been added, coupled to shadow key memory 14. Restrictive programming circuit 20 acts as a write circuit, for writing data received from scan chain and/or decryptor 10 into shadow key memory. This enables the replacement of keys during debugging. Restrictive programming circuit 20 is configured to impose restrictions on such replacement. In one embodiment, restrictive programming circuit 20 maintains a count of the number of time that the key has been updated in shadow key memory and disables updating after the count exceeds a predetermined threshold. In another embodiment, restrictive programming circuit 20 maintains a count of circuit clock cycles passed since a last previous time that the key has been updated in shadow key memory and disables updating until this count exceeds a predetermined threshold. A combination of both may be used. This type of restriction helps to prevent brute force attacks wherein hackers try many keys in order to gain privileged information.

Figure 3:
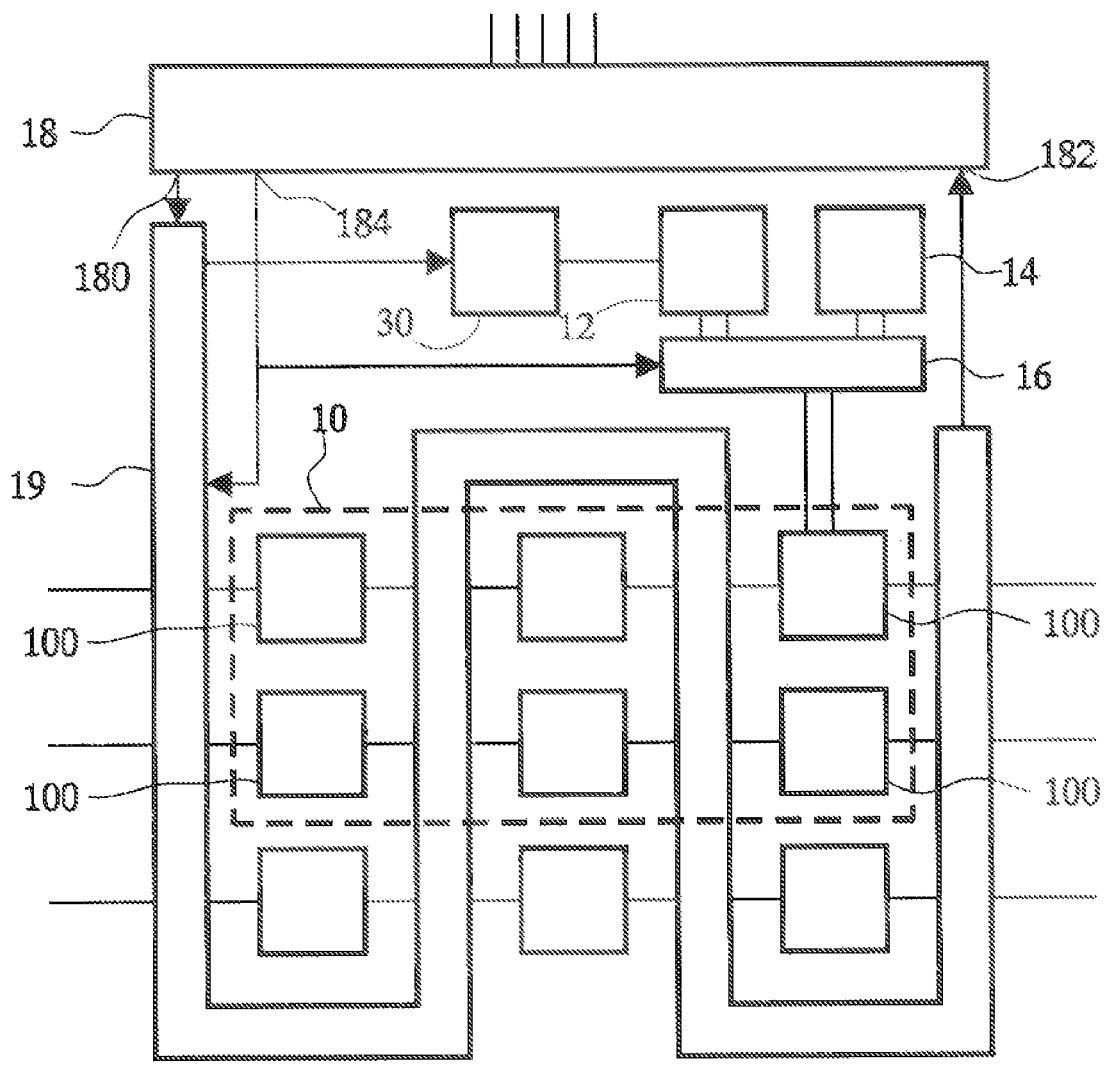

Although an embodiment has been shown wherein access to key memory 12 is completely prevented during testing, it should be noted that alternatively some access may be permitted for initial testing. For example, part of the scan chain may be coupled to key memory 12 for test purposes via a fuse or other one time programmable controlled circuit 30, as shown in FIG. 3. In this case one time programming may be performed to disable access after initial factory testing of the key memory 12. Any suitable irreversible way of preventing subsequent access may be used. In an embodiment multiplex circuit 16 may be configured to operation a first mode and a second mode, dependent on whether one time has been performed. In this case multiplex circuit 16 may be configured to couple decryptor 10 to key memory 12 in the first mode, irrespective of whether the circuit is in test mode and multiplex circuit 16 may be configured to couple decryptor 10 to key memory 12 or shadow key memory 14 in the second mode, dependent on whether the circuit is in test mode. Initially multiplex circuit 16 may be manufactured configured in the first mode. This makes it possible to test key memory 12, and subsequently blow a fuse or program or perform any other one time programmable action in order to allow for secure debugging using shadow key memory 14.

In a further embodiment an identity checking circuit may be added to make use of key memory 12 in the test mode dependent on the supply of identification such as a password. This makes it possible to perform tests or debugging using key memory 12 at any time when identification is available. However, such an approach may lower security, as the method of identification could leak out.

Although embodiments using key memory 12 and a shadow key memory 14 have been shown as privileged information supply circuit and shadow information supply circuit, it should be realized that these memories could be replaced by any other type of circuit that represents secret information. For example, key memory 12 could be replaced by a set of fuses wherein such information is programmed, or a logic circuit with a structure that represents secret information. Moreover, although separate memories have been shown, it should be appreciated that in an embodiment key memory 12 and a shadow key memory 14 may be different parts of a single memory matrix, which are accessed by multiplex circuit dependent on the mode of operation. A test enable signal may be used as a bit of an address in such a memory matrix. In another embodiment each of key memory 12 and a shadow key memory 14 may comprise a plurality of memories to supply different privileged information to different sub-circuits 100.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A circuit operable in a normal operating mode and a test mode, the circuit comprising:
   a testable circuit;
   a privileged information supply circuit for providing privileged information, selectively coupled to the testable circuit;
   a test access circuit coupled to the testable circuit;
   a test control circuit coupled to the test access circuit and configured to control switching of the test access circuit to the test mode,
   characterized by
   a shadow information supply circuit for providing shadow information that is a substitute for the privileged information; and
   a multiplex circuit coupled between the testable circuit and the privileged information supply circuit and the shadow information supply circuit, the multiplex circuit having a control input coupled to the test control circuit, the multiplex circuit being configured to couple the privileged information supply circuit to the testable circuit for access to privileged information or instead, selectively in response to a control signal from the test control circuit indicating that the test access circuit is enabled to capture test response signals from the testable circuit in the test mode, to couple the shadow information supply circuit to the testable circuit so that the privileged information and shadow information from the shadow information supply circuit are supplied to the testable circuit in the normal operating mode and the test mode, respectively.

2. A circuit is claimed in claim 1, wherein the privileged information supply circuit and the shadow information supply circuit both comprise an information storage circuit storing information for supply to the testable circuit.

3. A circuit is claimed in claim 1, wherein the testable circuit comprises a decryptor or encryptor circuit configured to use a key supplied by the privileged information supply circuit, or a verification circuit configured to perform a test of received information using information supplied by the privileged information supply circuit.

4. A circuit is claimed in claim 1 comprising a programming circuit configured to program information into the shadow information supply circuit when in the test mode.

5. A circuit is claimed in claim 4 wherein the programming circuit is configured to impose a restriction on a frequency and/or number of times at which it enables programming of the information into the shadow information supply circuit.

6. A circuit is claimed in claim 1 comprising a one time programmable circuit and a connection from the test access circuit to the privileged information supply circuit, configured to enable capture of signals dependent on the privileged information supply circuit into the test access circuit in the test mode via said connection before programming of the one time programmable circuit and to disable that capture in the test mode upon programming of the one time programmable circuit.

7. A circuit is claimed in claim 1, wherein the test control circuit is configured to apply a reset signal to a reset input of the test access circuit, automatically upon entering the test mode and/or when switching from the test mode.

8. A circuit is claimed in claim 1, wherein the test control circuit is configured to block output of information from registers in the test access circuit captured before switching to the test mode.

9. A method of operating a circuit that comprises a testable circuit, a privileged information supply circuit for providing privileged information, selectively coupled to the testable circuit and a test access circuit coupled to the testable circuit, the method comprising:
receiving a control signal indicating that the circuit is operated in a test mode, wherein test response signals from the testable circuit are accessible for the test access circuit; and
in response to said control signal, replacing a connection for accessing the privileged information from the privileged information supply circuit with the testable circuit by a connection between the testable circuit and a shadow information supply circuit for providing shadow information as a substitute for the privileged information, and
supplying the privileged information and the shadow information to the testable circuit in the normal operating mode and the test mode, respectively.

10. A method according to claim 9, comprising writing a copy of information in the privileged information supply circuit into the shadow information supply circuit from outside the circuit that comprises the testable circuit, the privileged information supply circuit and the test access circuit, when operating in the test mode.

* * * * *